US009209789B1

(12) United States Patent
Li et al.

(10) Patent No.: US 9,209,789 B1
(45) Date of Patent: Dec. 8, 2015

(54) APPARATUS TO CONVERT ELECTRICAL SIGNALS FROM SMALL-SIGNAL FORMAT TO RAIL-TO-RAIL FORMAT

(71) Applicant: QUALCOMM Incorporated, San Diego, CA (US)

(72) Inventors: Miao Li, San Diego, CA (US); Xiaohua Kong, San Diego, CA (US); Dong Ren, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/459,168

(22) Filed: Aug. 13, 2014

(51) Int. Cl.
*H03L 5/00* (2006.01)
*H03K 5/02* (2006.01)
*H03K 19/0175* (2006.01)

(52) U.S. Cl.
CPC .............. *H03K 5/02* (2013.01); *H03K 19/0175* (2013.01)

(58) Field of Classification Search
CPC ............... H03K 3/356113; H03K 19/018521; H03K 19/00315; H03K 17/102; H03K 3/012
USPC ................... 327/306, 333; 326/61–62, 80–81
See application file for complete search history.

(56) References Cited

U.S. PATENT DOCUMENTS

| 7,391,263 | B2 | 6/2008 | Koizumi et al. |
| 7,564,270 | B1 | 7/2009 | Zhang et al. |
| 7,609,097 | B2 * | 10/2009 | Leonowich ........ H03K 19/0005 326/81 |
| 7,834,696 | B2 * | 11/2010 | Giotta ................. H03F 3/45179 330/258 |
| 7,965,105 | B2 | 6/2011 | Dimitriu |
| 8,106,684 | B2 * | 1/2012 | Takeuchi .............. H03F 3/4521 326/83 |
| 8,446,173 | B1 | 5/2013 | Faucher et al. |
| 2014/0062568 | A1 | 3/2014 | Nishizawa |

* cited by examiner

*Primary Examiner* — Dinh Le
(74) *Attorney, Agent, or Firm* — Novak Druce Connolly Bove + Quigg LLP

(57) ABSTRACT

Techniques for converting a signal from a small-signal format into a rail-to-rail format are described herein. In one embodiment, a receiver comprises a voltage-level shifter configured to shift a common-mode voltage of a differential signal to obtain a level-shifted differential signal, an amplifier configured to amplify the level-shifted differential signal into an amplified differential signal, and a driver stage configured to convert the amplified differential signal into a rail-to-rail signal. The receiver also comprises a common-mode feedback circuit configured to generate a feedback voltage that is proportional to an output common-mode voltage of the amplifier, and to generate a bias voltage for input to the amplifier based on a difference between the feedback voltage and a reference voltage, wherein the output common-mode voltage of the amplifier depends on the bias voltage.

28 Claims, 9 Drawing Sheets

APPARATUS TO CONVERT ELECTRICAL SIGNALS FROM SMALL-SIGNAL FORMAT TO RAIL-TO-RAIL FORMAT

BACKGROUND

1. Field

Aspects of the present disclosure relate generally to receivers, and more particularly, to receivers for converting incoming signals from small-signal format to rail-to-rail format.

2. Background

A device may include a front-end analog receiver for receiving an incoming signal from another device. The front-end receiver may perform front-end processing on the received signal (e.g., equalization, filtering, amplification, signal-format conversion, etc.) before forwarding the signal to other components in the device for further processing. The other components may include one or more components that require a large signal in a rail-to-rail format. In this regard, the front-end receiver may convert the received signal (e.g., small-differential signal) to a large signal in a rail-to-rail format.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a receiver is described herein. The receiver comprises a voltage-level shifter configured to shift a common-mode voltage of a differential signal to obtain a level-shifted differential signal, an amplifier configured to amplify the level-shifted differential signal into an amplified differential signal, and a driver stage configured to convert the amplified differential signal into a rail-to-rail signal. The receiver also comprises a common-mode feedback circuit configured to generate a feedback voltage that is proportional to an output common-mode voltage of the amplifier, and to generate a bias voltage for input to the amplifier based on a difference between the feedback voltage and a reference voltage, wherein the output common-mode voltage of the amplifier depends on the bias voltage.

A second aspect relates to a method for signal-format conversion. The method comprises shifting a common-mode voltage of a differential signal to obtain a level-shifted differential signal, amplifying the level-shifted differential signal into an amplified differential signal using an amplifier, and converting the amplified differential signal into a rail-to-rail signal. The method also comprises generating a feedback voltage that is proportional to an output common-mode voltage of the amplifier, and generating a bias voltage for input to the amplifier based on a difference between the feedback voltage and a reference voltage, wherein the output common-mode voltage of the amplifier depends on the bias voltage.

A third aspect relates to an apparatus for signal-format conversion. The apparatus comprises means for shifting a common-mode voltage of a differential signal to obtain a level-shifted differential signal, means for amplifying the level-shifted differential signal into an amplified differential signal using an amplifier, and means for converting the amplified differential signal into a rail-to-rail signal. The apparatus also comprises means for generating a feedback voltage that is proportional to an output common-mode voltage of the amplifier, and means for generating a bias voltage for input to the amplifier based on a difference between the feedback voltage and a reference voltage, wherein the output common-mode voltage of the amplifier depends on the bias voltage.

A fourth aspect relates to a receiver. The receiver comprises an amplifier configured to amplify a differential signal into an amplified differential signal, and a driver stage configured to convert the amplified differential signal into a rail-to-rail signal. The receiver also comprises a common-mode voltage detection circuit configured to detect an input common-mode voltage of the amplifier, and a replica circuit that is driven by the detected input common-mode voltage, and configured to generate a feedback voltage based on the detected input common-mode voltage. The receiver further comprises a comparator having a first input configured to receive the feedback voltage, and a second input configured to receive a reference voltage, and configured to generate a bias voltage for input to the amplifier based on a difference between the feedback voltage and a reference voltage.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
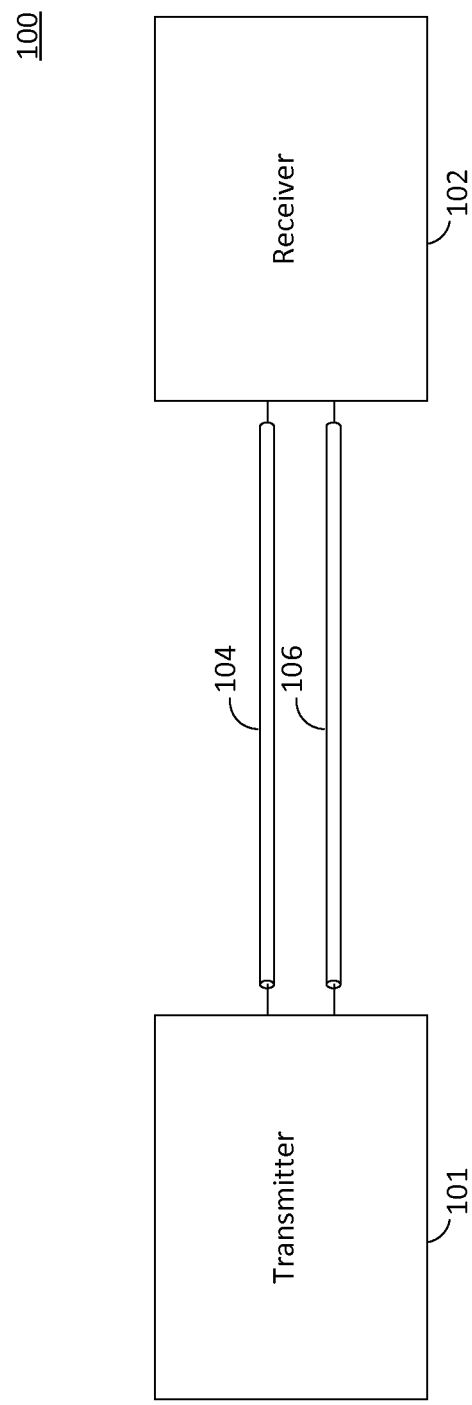
FIG. 1 shows an example of a system including a transmitter and a receiver.

FIG. 1 shows an example of a system 100 including a transmitter 101 and a receiver 102. The transmitter 101 may be located on a first device and the receiver 102 may be located on a second device, in which the transmitter 101 and the receiver 102 are used to transfer data from the first device to the second device over first and second transmission lines 104 and 106. The first and second transmission lines 104 and 106 may comprise a twisted wire pair, traces on a printed circuit board and/or chip, conductors in a coaxial cable or another type of cable, etc. The transmitter 101 may transmit a differential data signal to the receiver 102 over the first and second transmission lines 104 and 106. The receiver 102 may perform front-end processing (e.g., equalization, filtering, amplification, signal-format conversion, etc.) on the received signal before forwarding the signal to other components in the second device for further processing.

It is often desirable to convert a small-differential signal (data or clock) from the transmitter 101 to a large signal in a rail-to-rail format at the receiver 102 for digital processing and/or power saving. For example, the transmitter 101 may transmit a clock from a clock generator (e.g., inductor-capacitor (LC) tank), and the receiver 102 may convert the received clock to a large signal in a rail-to-rail format for further processing. In this example, the clock may start as a large signal at the transmitter 101 and become a small signal at the receiver 102 due to signal attenuation (e.g., in the transmission lines 104 and 106). Another example, in which signal-format conversion is performed is a loop back data path, is discussed further below.

Figure 2:
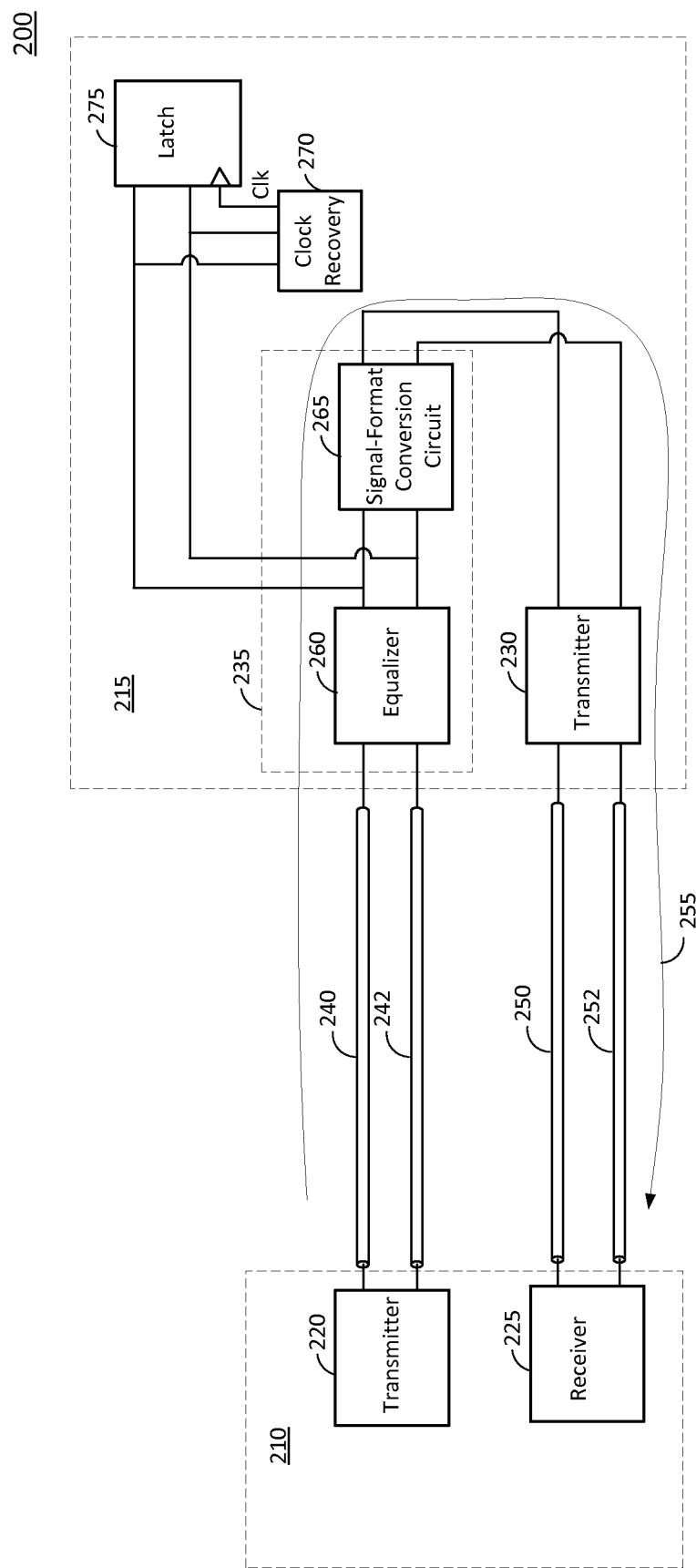
FIG. 2 shows a receiver according to an embodiment of the present disclosure.

FIG. 2 shows a system 200 comprising a tester 210 and a device 215 (e.g., system on a chip (SoC)) according to an embodiment of the present disclosure. The tester 210 comprises a first transmitter 220 and a first receiver 225, and the device 215 comprises a second transmitter 230 and a second receiver 235. The first transmitter 220 may be configured to transmit a large-differential signal to the second receiver 235 over first and second transmission lines 240 and 242. The large-differential signal may become a small-differential signal at the second receiver 235 due to signal attenuation. The second transmitter 230 may be configured to transmit a large-differential signal to the first receiver 225 over third and fourth transmission lines 250 and 252. It is to be appreciated that a large-differential signal may be approximately rail-to-rail or less than rail-to-rail. Together, the first and second transmission lines 240 and 242, the second receiver 235, the second transmitter 230, and the third and fourth transmission lines 250 and 252 form a loop back data path 255. In one embodiment, the tester 210 may use the loop back data path 255 to estimate jitter performance at the second receiver 235, as discussed further below.

The second receiver 235 comprises an equalizer 260 and a signal-format conversion circuit 265. In one embodiment, the equalizer 260 may be configured to reduce distortion in an incoming signal due to bandwidth limitations of the first and second transmission lines 240 and 242. For example, the first and second transmission lines 240 and 242 may distort the signal by attenuating the higher frequency components of the signal. In this example, the equalizer 260 may peak the incoming signal at higher frequencies to compensate for signal attenuation at higher frequencies, and therefore reduce distortion in the signal.

The signal-format conversion circuit 265 converts the signal at the differential output of the equalizer 260 to a large signal in a rail-to-rail format. The resulting rail-to-rail signal may be routed to the second transmitter 230 to drive the second transmitter 230. The second transmitter 230 may transmit the rail-to-rail signal as a large-differential signal to the first receiver 225 over the third and fourth transmission lines 250 and 252.

The device 215 may also comprise a clock recovery circuit 270 and a data latch 275. The clock recovery circuit 270 and data latch 275 may be used to process a data signal during normal operation of the device 215 when jitter performance is not being tested by the tester 210. During normal operation, the device 215 may be coupled to another device (not shown) that transmits a data signal (e.g., high speed serializers/deserializers (SerDes) signal) to the device 215 over a pair of transmission lines (e.g., first and second transmission lines 240 and 242). In this regard, the equalizer 260 may equalize the received data signal, and the clock recovery circuit 270 may generate a clock signal (CLK) from the equalized data signal (e.g., by detecting transitions in the equalized data signal). The clock recovery circuit 270 may input the clock signal to a clock input of the latch 275. The latch 275 may sample the equalized data signal on rising and/or falling edges of the clock signal to recover data (e.g., data bits) from the equalized data signal.

Although the clock recovery circuit 270 and latch 275 are shown coupled to the differential output of the equalizer 260 in FIG. 2, it is to be appreciated that the clock recovery circuit 270 and latch 275 are not limited to this example. For example, the clock recovery circuit 270 and latch 275 may be coupled to the output of the signal-format conversion circuit 265, and perform clock and data recovery on the rail-to-rail signal output from the signal-format conversion circuit 265.

As discussed above, the tester 210 may use the loop back data path 255 to estimate jitter performance at the second receiver 235. In this regard, the first transmitter 220 may transmit a test signal (e.g., large-differential signal) to the second receiver 235 over the first and second transmission lines 240 and 242. The test signal may become a small-differential signal at the second receiver 235 due to signal attenuation. At the second receiver 235, the equalizer 260 equalizes the received test signal, and the signal-format conversion circuit 265 converts the equalized test signal to a rail-to-rail signal, which is routed to the second transmitter 230. The second transmitter 230 transmits the rail-to-rail signal as a large-differential signal to the first receiver 225 over the third and fourth transmission lines 250 and 252. The third and fourth transmission lines 250 and 252 may be high-quality transmission lines that introduce much less jitter into the signal than the first and second transmission lines 240 and 242. This allows a processor (not shown) on the tester 210 to estimate jitter performance at the second receiver 235 from the signal received by the first receiver 225. Thus, the test signal transmitted by the tester 210 is looped back to the tester 210 after going through the receiver 235 and transmitter 230 of the device 215 to estimate jitter performance.

Figure 3:
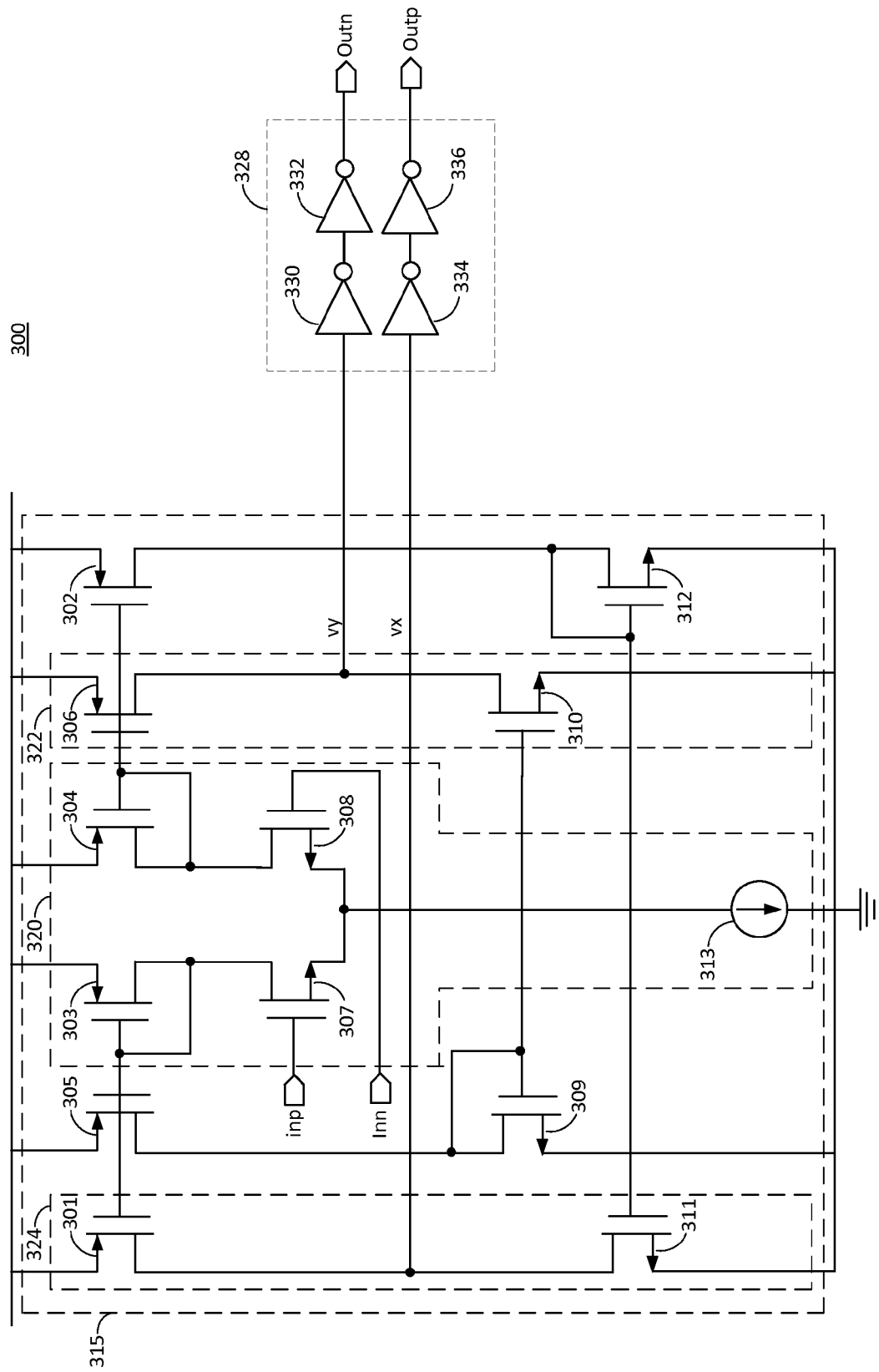
FIG. 3 shows an exemplary implementation of a signal-format conversion circuit according to an embodiment of the present disclosure.

FIG. 3 shows an example of a signal-format conversion circuit 300 configured to convert a small-differential signal at a differential input (Inp, Inn) of the circuit 300 to a large signal in a rail-to-rail format at a differential output (Outp, Outn) of the circuit 300. The signal-format conversion circuit 300 may be used to implement the signal-format conversion circuit 265 shown in FIG. 2 with the differential input (Inp, Inn) coupled to the differential output of the equalizer 260 and the differential output (Outp, Outn) coupled to a differential input of the second transmitter 230.

The signal-format conversion circuit 300 comprises a wideband differential amplifier 315. The amplifier 315 comprises a first stage 320, a first output stage 322, and a second output stage 324. The first stage 320 comprises first and second input n-type metal-oxide-semiconductor (NMOS) transistors 307 and 308, a first diode-connected p-type metal-oxide-semiconductor (PMOS) transistor 303 coupled to the drain of the first input NMOS transistor 307, a second diode-connected PMOS transistor 304 coupled to the drain of the second input NMOS transistor 308, and a current source 313 coupled to the sources of the first and second input NMOS transistors 307 and 308. The current source 313 provides a bias current for the first and second NMOS transistors 307 and 308.

In operation, the gates of the first and second input NMOS transistors 307 and 308 are driven by a small-differential signal (differential input voltage) at the differential input (Inp, Inn) of the amplifier. The differential input comprises a first input (Inp) coupled to the gate of the first input NMOS transistor 307, and a second input (Inn) coupled to the gate of the second input NMOS transistor 308. In response to the differential signal (differential input voltage), the first and second input NMOS transistors 307 and 308 produce small-signal drain currents that are related to the differential signal (differential input voltage) by the transconductances of the first and second input NMOS transistors 307 and 308.

The first output stage 322 comprises a first output PMOS transistor 306 and a first output NMOS transistor 310, in which the output (vy) of the first output stage 322 is coupled to the drains of the transistors 306 and 310. In operation, the drain current of the first input NMOS transistor 307 is mirrored at the drain of the first output NMOS transistor 310 by PMOS transistors 303 and 305 and NMOS transistor 309, and the drain current of the second NMOS transistor 308 is mirrored at the drain of the first output PMOS transistor 306 by PMOS transistor 304. The first output stage 322 has a high output resistance, and therefore provides high voltage gain.

The second output stage 324 comprises a second output PMOS transistor 301 and a second output NMOS transistor 311, in which the output (vx) of the second output stage 324 is coupled to the drains of the transistors 301 and 311. In operation, the drain current of the first input NMOS transistor 307 is mirrored at the drain of the second output PMOS transistor 301 by PMOS transistor 303, and the drain current of the second NMOS transistor 308 is mirrored at the drain of the second output NMOS transistor 311 by PMOS transistors 304 and 302 and NMOS transistor 312. The second output stage 324 has a high output resistance, and therefore provides high voltage gain.

Thus, the wideband differential amplifier 315 converts the small-differential signal at the differential amplifier input (Inp, Inn) into a large-differential signal at the differential amplifier output (vx, vy), where the differential amplifier output (vx, vy) comprises the outputs of the first and second output stages 322 and 324.

The signal-format conversion circuit 300 also comprises a driver stage 328 configured to convert the large-differential signal at the differential amplifier output (vy, vx) into a rail-to-rail signal at the differential output (Outp, Outn) of the signal-format conversion circuit 300. In this regard, the driver stage 328 comprises first and second serial inverters 330 and 332 coupled to the output (vy) of the first output stage 322 of the amplifier, and third and fourth serial inverters 334 and 336 coupled to the output (vx) of the second output stage 324 of the amplifier.

The signal-format conversion circuit 300 has high gain and large operational bandwidth. However, the signal-format conversion circuit 300 has poor duty-cycle performance because the bias voltages at the amplifier outputs (vx, vy) vary substantially over process-voltage-temperature (PVT).

Figure 4:
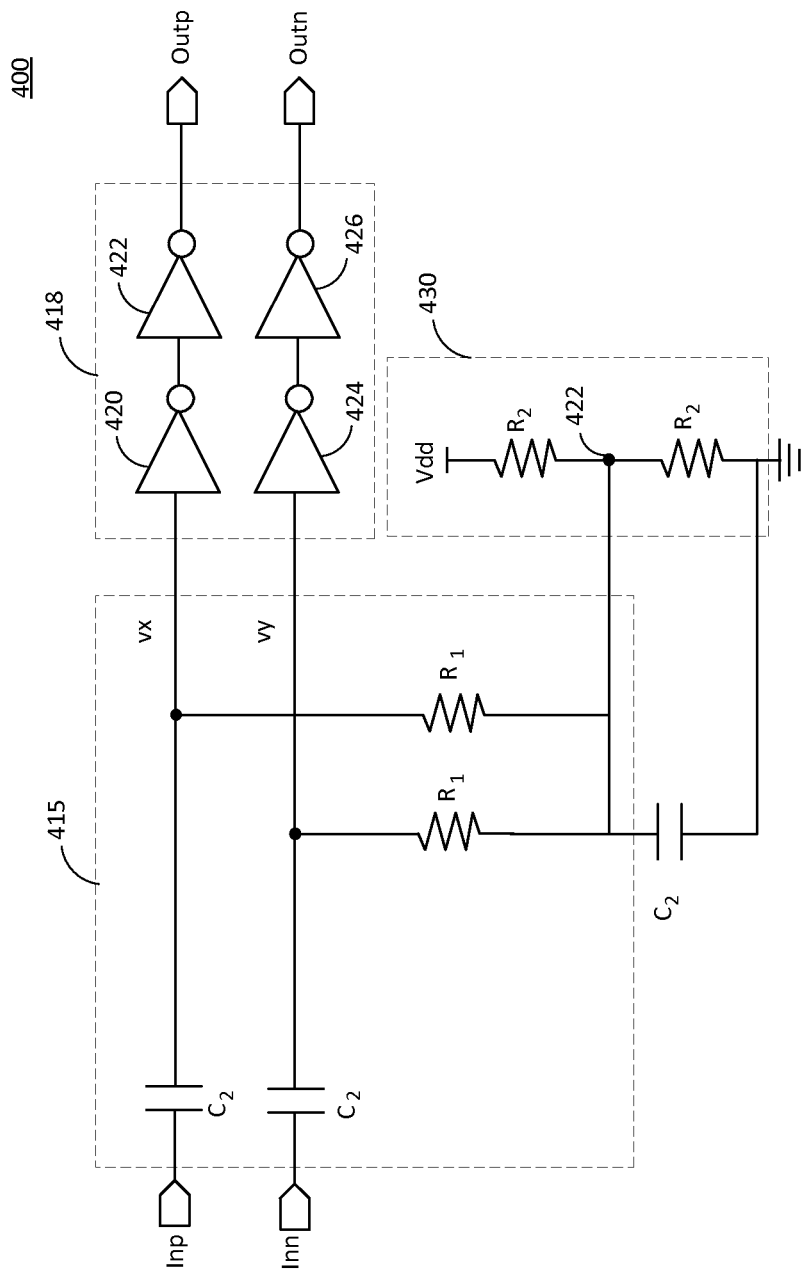
FIG. 4 shows an exemplary implementation of a signal-format conversion circuit according to another embodiment of the present disclosure.

FIG. 4 shows another example of a signal-format conversion circuit 400 configured to convert a small-differential signal at a differential input (Inp, Inn) of the circuit 400 to a large signal in a rail-to-rail format at a differential output (Outp, Outn) of the circuit 400. The differential input comprises a first input (Inp) and a second input (Inn). The signal-format conversion circuit 400 includes a high-pass filter network 415, a voltage divider 430, a capacitor C2 for reducing jitter noise, and a driver stage 418. The high-pass filter network 415 comprises a separate AC-coupling capacitor C1 coupled to each input of conversion circuit 400. The AC-coupling capacitors C1 are used to couple AC components of the input differential signal to the driver stage 418 while blocking DC components of the input differential signal. The filter network 415 also comprises two resistors R1 coupled in series between the outputs (vx, vy) of the filter network 415. The voltage divider 430 comprises two series resistors R2 configured to provide a voltage equal to half the power supply voltage Vdd at node 422. The voltage at node 422 is coupled between the resistors R1 of the filter network 415, and sets the common-mode voltage for the outputs (vx, vy) of the filter network 415 to half the power supply voltage. As a result, the outputs (vx, vy) of the filter network 415 are biased at half the power supply voltage, which is an ideal bias for achieving high duty-cycle performance.

The driver stage 418 is configured to convert the differential signal at the filter outputs (vy, vx) into a rail-to-rail signal at the differential output (Outp, Outn) of the signal-format conversion circuit 400. In this regard, the driver stage 418 comprises first and second serial inverters 420 and 422 coupled to one of the outputs (vx) of the filter network 415, and third and fourth serial inverters 424 and 426 coupled to the other output (vy) of the filter network 415.

The signal-format conversion circuit 400 has high duty-cycle performance. However, the high-pass filter network 415 has no gain amplification and is limited for wideband data operation. To achieve wideband data operation, the resistors R1 and capacitors C1 need to be very large to include low-frequency components. As a result, it takes a long time for data at the outputs (vx, vy) of the filter network 415 to settle. Thus, it is desirable for a conversion circuit capable of wideband operation with high duty-cycle performance.

Figure 5:
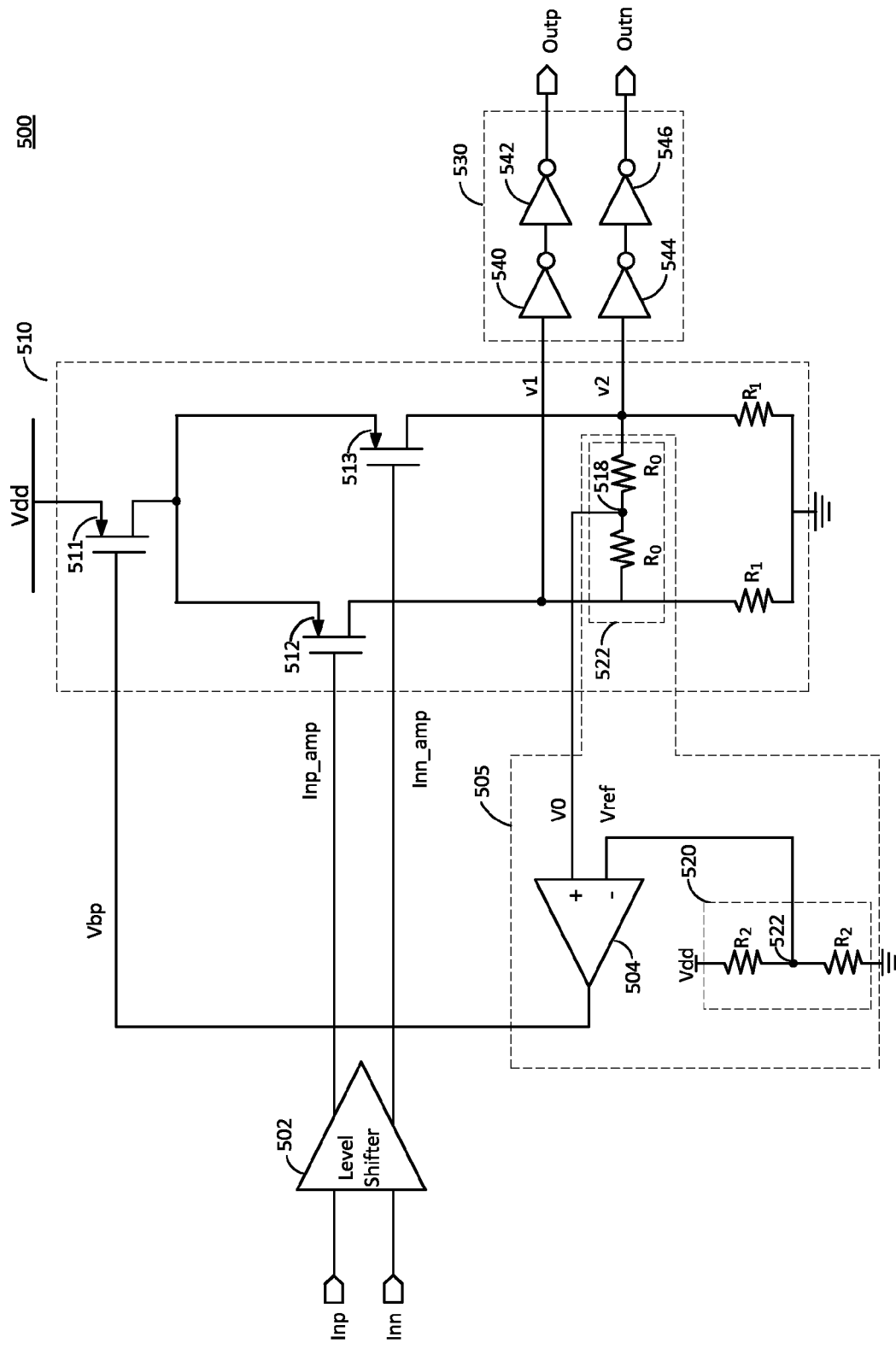
FIG. 5 shows a signal-format conversion circuit with a common-mode feedback loop according to an embodiment of the present disclosure.

FIG. 5 shows a signal-format conversion circuit 500 with a common-mode feedback loop for converting a small-differential signal into a rail-to-rail signal according to an embodiment of the present disclosure. The conversion circuit is capable of wideband operation with high duty-cycle performance, as discussed further below. The conversion circuit 500 comprises a voltage-level shifter 502, a wideband differential amplifier 510, a driver stage 530, and a common-mode feedback circuit 505. The common-mode feedback circuit 505 comprises a comparator 504, a voltage divider 520, and an output common-mode voltage detection circuit 522.

The level shifter 502 is configured to receive a small-differential signal at a differential input (Inp, Inn) of the conversion circuit 500, and to down shift the voltage level of the differential signal by a certain amount. The level-shifted differential signal is then input to a differential input (Inp_amp, Inn_amp) of the amplifier 510. Thus, the level shifter 502 down shifts the voltage level of the differential input signal before inputting the differential signal to the amplifier 510.

The differential amplifier 510 comprises first and second driving transistors 512 and 513, two load resistors R1, and a bias transistor 511. The bias transistor 511 provides a bias current for the first and second driving transistors 512 and 513 based on a bias voltage vbp applied to the gate of the bias transistor 511. The bias transistor 511 may also be referred to as a current source transistor.

As shown in the example in FIG. 5, each of the transistors 511, 512 and 513 in the amplifier 510 may comprise a PMOS transistor. In this example, each input (Inp_amp, Inn_amp) of the amplifier 510 is coupled to the gate of a respective one of the driving transistors 512 and 513. Thus, the small level-shifted differential signal from the level shifter 502 is applied to the gates of the first and second driving transistors 512 and 513. The source of the bias transistor 511 is coupled to a supply voltage Vdd, and the drain of the bias transistor 511 is coupled to the sources of the driving transistors 512 and 513. The drain of each driving transistor 512 and 513 is coupled to a respective one of the load resistors R1. The amplifier 510 has a differential output comprising a first output (v1) coupled to the drain of the first driving transistor 512, and a second output (v2) coupled to the drain of the second driving transistor 513.

In operation, the amplifier 510 amplifies the small level-shifted differential signal from the level shifter 502 into a large differential signal at the differential output (v1, v2) of the amplifier 510. In order for the amplifier 510 to achieve high gain, the driving transistors 512 and 513 need to operate in the saturation region. This is because the driving transistors 512 and 513 have high output resistances when operated in the saturation region, which result in high gain. As discussed further below, down shifting the voltage level of the input differential signal before inputting the differential signal to the amplifier helps ensure that the driving transistors 512 and 513 operate in the saturation region for cases where the input differential signal has a high common-mode voltage (e.g., a common-mode voltage near the supply voltage Vdd).

The common-mode voltage detection circuit 522 is configured to detect the output common-mode voltage of the amplifier. In one embodiment, the common-mode voltage detection circuit 522 comprises two resistors R0 coupled in series between the outputs (v1, v2) of the amplifier 510, where the resistors R0 have equal resistances. The voltage V0 at the node 518 between the series resistors R0 is approximately equal to the common-mode voltage at the differential output (v1, v2) of the amplifier 530. Thus, the voltage V0 provides the feedback circuit 505 with feedback on changes in the output common-mode voltage in response to changes in the bias voltage vbp, and may therefore by referred to as a feedback voltage.

The voltage divider 520 generates a reference voltage Vref equal to half the power supply voltage Vdd. The reference voltage Vref represents a desired common-mode voltage equal to half the power supply voltage Vdd. To generate the reference voltage Vref, the voltage divider 520 comprises two resistors R2 coupled in series between the power supply voltage Vdd and ground, where the resistors have equal resistances. The reference voltage Vref is generated at the node 522 between the series resistors R2.

The feedback voltage V0 (which is approximately equal to the output common-mode voltage of the amplifier) is fed to a first input of the comparator 504, and the reference voltage Vref (representing the desired common-mode voltage) is fed to a second input of the comparator 504. The output of the comparator 504 generates the bias voltage Vbp for the bias transistor 511.

In operation, the comparator 504 compares the difference between the feedback voltage V0 and the reference voltage Vref, and adjusts the bias voltage Vbp based on the comparison in a direction that minimizes the difference between V0 and Vref. In other words, the comparator 504 adjusts the bias voltage Vbp until the feedback voltage V0 is approximately equal to the reference voltage Vref. Because the reference voltage Vref is equal to half the power supply voltage and the feedback voltage is equal to the output common-mode voltage, this causes the output common-mode voltage of the amplifier 510 to be approximately equal to half the power supply voltage.

The driver stage 530 is configured to convert the large-differential signal at the differential output (v1, v2) of the amplifier 510 into a rail-to-rail signal at the differential output (Outp, Outn) of the conversion circuit 500. In this regard, the driver stage 530 comprises first and second serial inverters 540 and 542 coupled to one of the outputs (v1) of the amplifier 510, and third and fourth serial inverters 544 and 546 coupled to the other output (v2) of the amplifier 510. The large-differential signal input to the driver stage 530 may drive the outputs of inverters 542 and 546 rail to rail to generate the rail-to-rail signal. For example, if the inverters are powered between a first rail at the supply voltage Vdd and a second rail coupled to ground, then the rail-to-rail signal may have a voltage swing approximately equal to Vdd. In general, the rail-to-rail signal may have a voltage swing approximately equal to the voltage difference between two rails used to power the inverters.

As discussed above, the common-mode feedback loop sets the output common-mode voltage of the amplifier approximately equal to half the supply voltage Vdd. This helps balance the rise and fall times at the outputs of the inverters 540, 542, 544 and 546 of the driver stage 530, thereby achieving high duty-cycle performance (a duty cycle close to 50%).

Figure 6:
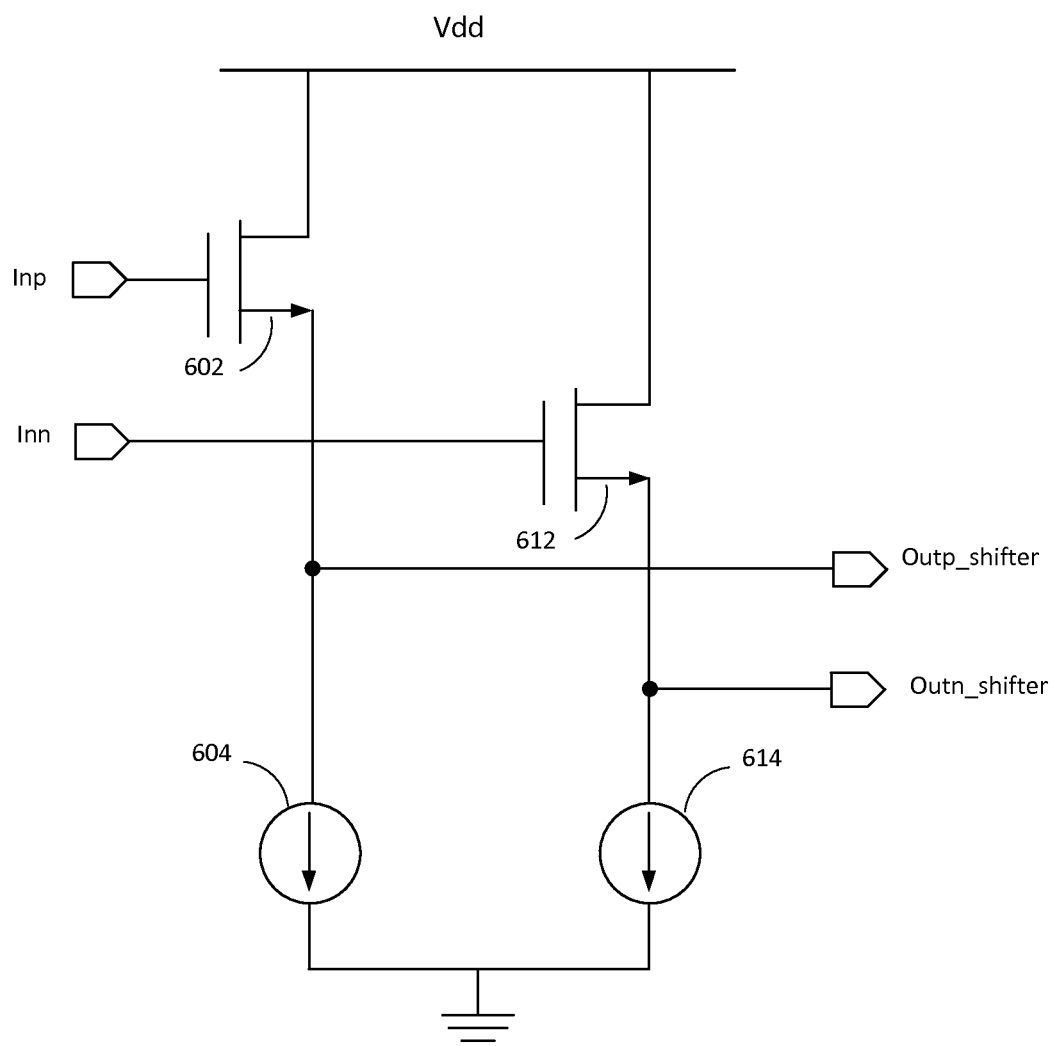
FIG. 6 shows a level shifter according to an embodiment of the present disclosure.

FIG. 6 shows an exemplary implementation of the level shifter 502 according to an embodiment of the present disclosure. The level shifter 502 includes a first NMOS transistor 602, a second NMOS transistor 612, a first current source 604, and a second current source 614. The drains of the first NMOS transistor 602 and the second NMOS transistor 612 are coupled to the supply voltage Vdd. The source of the first NMOS transistor 602 is coupled to the first current source 604, and the source of the second NMOS transistor 612 is coupled to the second current source 614. Each current source 604 and 614 provides a bias current for the respective NMOS transistor 602 and 612. The differential input of the level shifter 502 comprises a first input (Inp) coupled to the gate of the first NMOS transistor 602, and a second input (Inn) coupled to the gate of the second NMOS transistor 612. The differential output of the level shifter 502 comprises a first output (Outp_shifter) coupled to the source of the first NMOS transistor 602, and a second output (Outn_shifter) coupled to the source of the second NMOS transistor 612.

The first NMOS transistor 602 is connected to the respective input (Inp) and output (Outp_shifter) in a source-follower configuration. As a result, the first NMOS transistor 602 down shifts the signal at the respective input (Inp) by a voltage level approximately equal to the gate-to-source voltage (Vsg_1) of the first NMOS transistor 602. The gate-to-source voltage (Vgs_1) depends on the bias current provided by the first current source 604, and may be slightly higher than the threshold voltage of the first NMOS transistor 602.

The second NMOS transistor 612 is connected to the respective input (Inn) and output (Outn_shifter) in a source-follower configuration. As a result, the second NMOS transistor 612 down shifts the signal at the respective input (Inn) by a voltage level approximately equal to the gate-to-source voltage (Vsg_2) of the second NMOS transistor 612. The gate-to-source voltage (Vgs_2) depends on the bias current provided by the second current source 614, and may be slightly higher than the threshold voltage of the second NMOS transistor 612.

In one aspect, the first and second NMOS transistors 602 and 612 may be matched and have approximately equal bias currents. In this aspect, the first and second NMOS transistors may have approximately the same gate-to-source voltage. As a result, the level shifter 502 may down shift the common-mode voltage of the differential input signal by the gate-to-source voltage of the first and second NMOS transistors 602 and 612.

As discussed above, the level shifter 502 may be used to down shift the common-mode voltage of the differential input signal before inputting the differential signal to the differential input (Inp_amp, Inn_amp) of the amplifier 510. This helps ensure that the first and second driving transistors 512 and 513 of the amplifier 510 operate in the saturation region to achieve high gain in cases where the differential input signal has a high common-mode voltage (e.g., common-mode voltage near the supply voltage Vdd). The differential input signal may have a high-common voltage, for example, when the equalizer 260 is an NMOS-based equalizer.

In the example shown in FIG. 5, each of the first and second driving transistors 512 and 513 is a PMOS transistor. As a result, the source-to-gate voltage of each driving transistor 512 and 513 may need to be above the absolute threshold voltage of the driving transistor in order to operate in the saturation region. In cases where the differential input signal has a high common-mode voltage near the supply voltage Vdd, this condition may not be met over the voltage swing of the differential input signal. By down shifting the common-mode voltage of the differential input signal before the differential input signal is input to the amplifier, the level shifter 502 helps ensure that the condition for operation in the saturation region is met, and therefore high gain is achieved.

Figure 7:
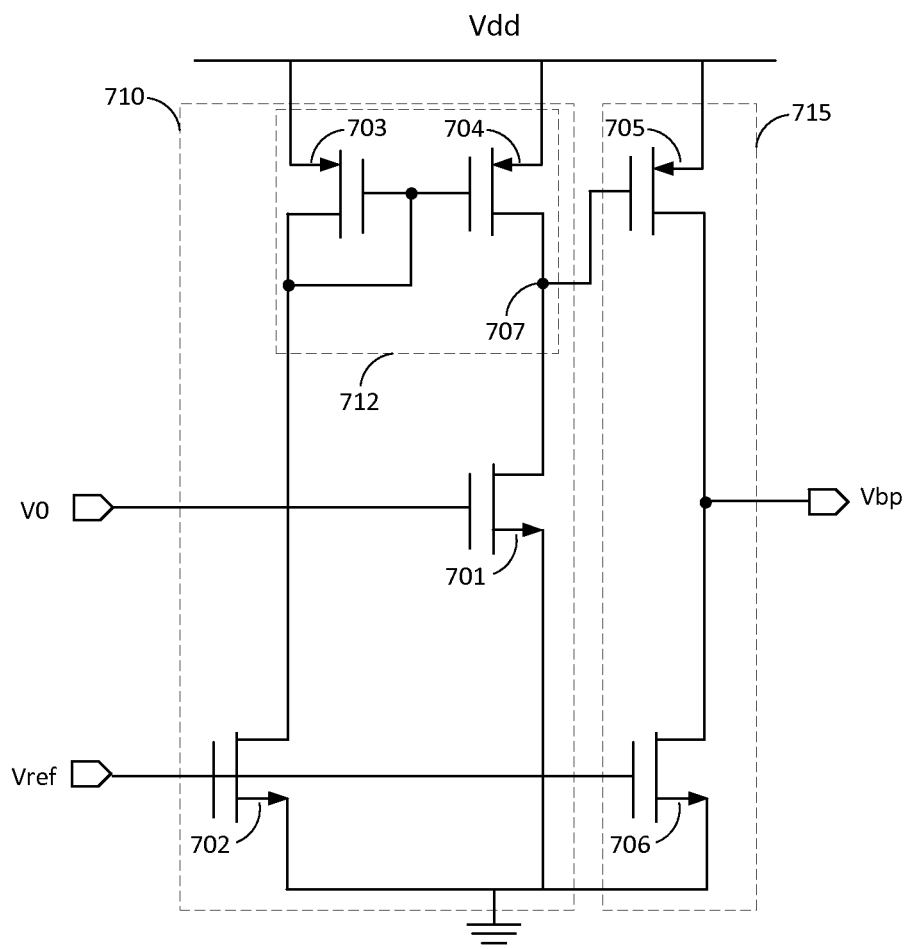
FIG. 7 shows a comparator according to an embodiment of the present disclosure.

FIG. 7 shows an exemplary implementation of the comparator 504 according to an embodiment of the present disclosure. The comparator 504 includes a first stage 710, and an output stage 715. The first stage 710 comprises a first NMOS transistor 701, a second NMOS transistor 702, a first PMOS transistor 703, and a second PMOS transistor 704. The gate of the first NMOS transistor 701 is coupled to the feedback voltage V0, and the gate of the second NMOS transistor 702 is coupled to the reference voltage Vref. The first and second PMOS transistors 703 and 704 form a current-mirror load 712 coupled to the drains of the first and second transistors 701 and 702, as shown in FIG. 7. The sources of the first and second NMOS transistors 701 and 702 are coupled directly to ground instead of a current source. This allows the comparator 504 to operate with a lower supply voltage, and consume less current, thereby reducing power consumption.

The output stage 715 comprises a third PMOS transistor 705 and a third NMOS transistor 706. The output of the comparator (which provides the bias voltage vbp for the bias transistor 511) is coupled to the drains of the third PMOS transistor 705 and the third NMOS transistor 706. The gate of the third PMOS transistor 705 is coupled to an output node 707 of the third stage 710, and the gate of the third NMOS transistor 706 is coupled to the reference voltage Vref.

In operation, when the feedback voltage V0 is greater than the reference voltage Vref, the output 707 of the first stage 710 may be driven low. This causes the third PMOS 705 to pull up the output of the output stage 715. This increases the bias voltage vpb applied to the gate of the bias transistor 511, which, in turn, reduces the bias current provided by the bias transistor 511. The reduced bias current reduces the voltage drop across the load resistors R1. As a result, the bias voltage at the amplifier outputs (v1, v2), and hence the feedback voltage V0, is reduced. The reduction in the feedback voltage V0 reduces the difference between the feedback voltage V0 and the reference voltage Vref.

When the reference voltage Vref is greater than the feedback voltage V0, the output 707 of the first stage 710 may be driven high. This causes the third PMOS 705 of the output stage 715 to turn off, allowing the third NMOS transistor 706 (which is turned on by the reference voltage Vref) to pull down the output of the output stage 715. This reduces the bias voltage vpb applied to the gate of the bias transistor 511, which, in turn, increases the bias current provided by the bias transistor 511. The increased bias current increases the voltage drop across the load resistors R1. As a result, the bias voltage at the amplifier outputs (v1, v2), and hence the feedback voltage V0, is increased. The increase in the feedback voltage V0 reduces the difference between the feedback voltage V0 and the reference voltage Vref. Thus, when coupled into the common-mode feedback loop, the comparator 504 adjusts the bias voltage vbp of the bias transistor 511 is a direction that reduces the difference between the feedback voltage V0 and the reference voltage Vref.

Figure 8:
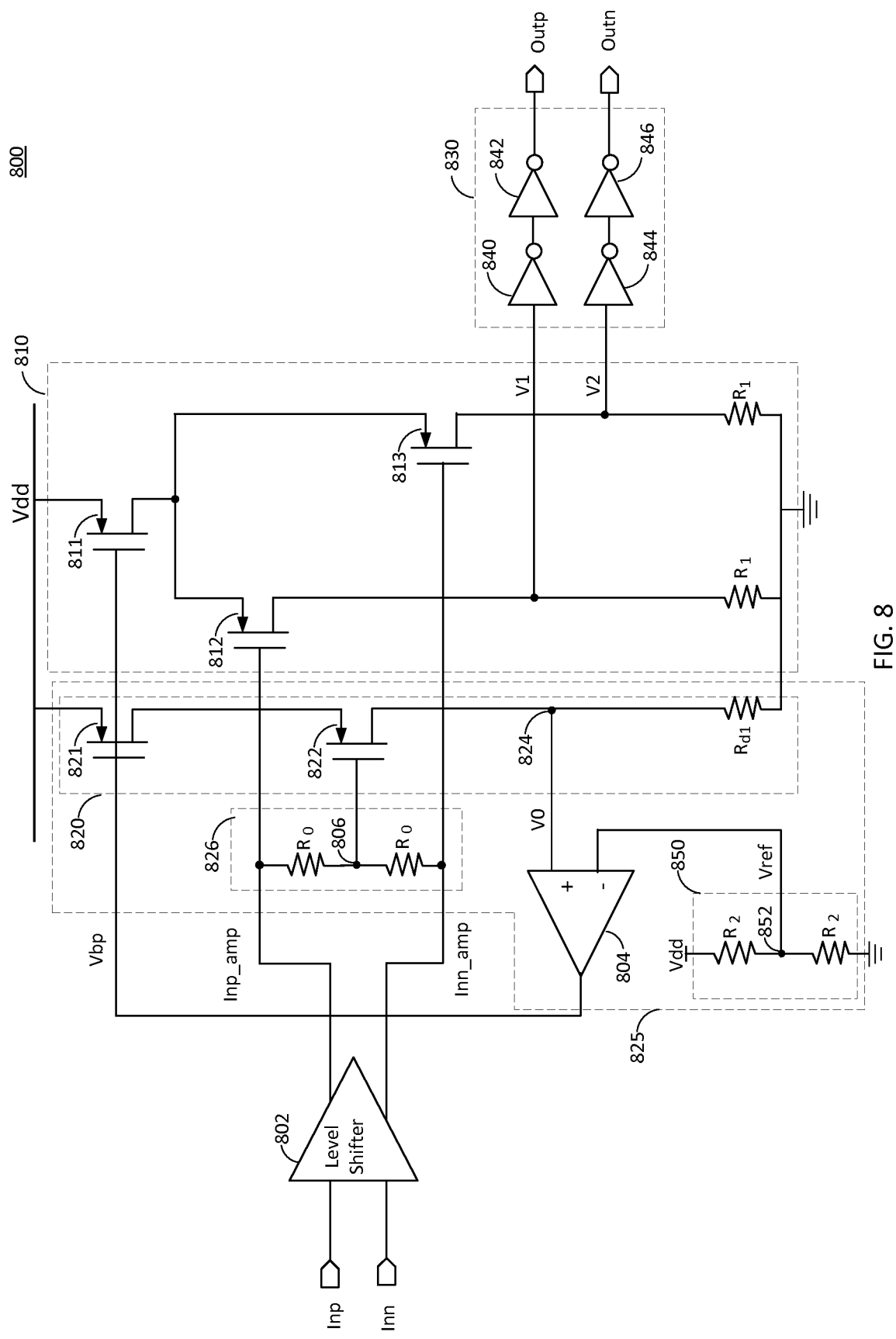
FIG. 8 shows a signal-format conversion circuit with a common-mode feedback loop according to another embodiment of the present disclosure.

FIG. 8 shows a signal-format conversion circuit 800 with a common-mode feedback loop for converting a small-differential signal into a rail-to-rail signal according to another embodiment of the present disclosure. The conversion circuit 800 comprises a voltage-level shifter 802, a differential amplifier 810, a driver stage 830, and a common-mode feedback circuit 825. The common-mode feedback circuit 825 comprises a replica circuit 820, a comparator 804, a voltage divider 850, and an input common-mode voltage detection circuit 826. The conversion circuit 800 in FIG. 8 differs from the conversion circuit 500 in FIG. 5 in that the feedback voltage V0 fed to the comparator 804 is provided by the replica circuit 820, which tracks the output common-mode voltage of the amplifier 810, as discussed further below.

The level shifter 802 is configured to receive a small-differential signal at a differential input (Inp, Inn) of the conversion circuit 800, and to down shift the voltage level of the differential signal by a certain amount. The level-shifted differential signal is then input to a differential input (Inp_amp, Inn_amp) of the amplifier 810. Thus, the level shifter 802 down shifts the voltage level of the differential input signal before inputting the differential signal to the amplifier 810. The level shifter 802 may be implemented using the level shifter shown in FIG. 6.

The differential amplifier 810 comprises first and second driving transistors 812 and 813, two load resistors R1, and a first bias transistor 811. The first bias transistor 811 provides a bias current for the first and second driving transistors 812 and 813 based on a bias voltage vbp applied to the gate of the first bias transistor 811.

As shown in the example in FIG. 8, each of the transistors 811, 812 and 813 in the amplifier 810 may comprise a PMOS transistor. In this example, each input (Inp_amp, Inn_amp) of the amplifier 810 is coupled to the gate of a respective one of the driving transistors 812 and 813. Thus, the small level-shifted differential signal from the level shifter 802 is applied to the gates of the first and second driving transistors 812 and 813. The source of the first bias transistor 811 is coupled to a supply voltage Vdd, and the drain of the first bias transistor 811 is coupled to the sources of the driving transistors 812 and 813. The drain of each driving transistor 812 and 813 is coupled to a respective one of the load resistors R1. The amplifier 810 has a differential output comprising a first output (v1) coupled to the drain of the first driving transistor 812, and a second output (v2) coupled to the drain of the second driving transistor 813.

In operation, the amplifier 810 amplifies the small level-shifted differential signal from the level shifter 802 into a large differential signal at the differential output (v1, v2) of the amplifier 810. As discussed above, down shifting the voltage level of the input differential signal before inputting the differential signal to the amplifier helps ensure that the driving transistors 812 and 813 operate in the saturation region for cases where the input differential signal has a high common-mode voltage (e.g., a common-mode voltage near the supply voltage Vdd).

The replica circuit 820 comprises a second bias transistor 821, a third driving transistor 822, and a load resistor Rd1. In the example in FIG. 8, the second bias transistor 821 and the third driving transistor 822 each comprise a PMOS transistor. The source of the second bias transistor 821 is coupled to the supply voltage Vdd, and the drain of the bias transistor 821 is coupled to the source of the third driving transistor 822. The drain of the third driving transistor 822 is coupled to the load resistor Rd1. The gate of the second bias transistor 821 is coupled to the bias voltage vbp, and provides a bias current for the third driving transistor 822 based on a bias voltage vbp.

The input common-mode voltage detection circuit 826 is configured to detect an input common-mode voltage of the amplifier 810. In this regard, the input common-mode voltage may comprise two resistors R0 coupled in series between the inputs (Inp_amp, Inn_amp) of the amplifier 810, where the resistors have equal resistances. As a result, the input common-mode voltage is detected at the node 806 located between the resistors R0. The gate of the third driving transistor 822 is coupled to node 806, and is therefore driven by the detected input common-mode voltage from node 806.

In operation, the voltage at node 824 of the replica circuit 820 tracks the output common-mode voltage of the amplifier 810, in which node 824 is located between the drain of the third driving transistor 822 and the load resistor Rd1. In one aspect, the second bias transistor 821 may have half the gate width of the first bias transistor 811, and the first, second, and third driving transistors 812, 813 and 822 may have approximately the same gate widths. In addition, the load resistors R1 and Rd1 may have approximately the same resistances. In this aspect, the second bias transistor 821 produces a bias current that is approximately equal to half the bias current provided by the first bias transistor 811 for a given bias voltage vbp. Assuming the bias current provided by the first bias transistor 811 is evenly split between the first and second driving transistors 812 and 813, this results in the first, second and third driving transistors 812, 813 and 822 receiving approximately the same bias current. As a result, when the third driving transistor 822 is driven by the input common-mode voltage, the voltage V0 at node 824 of the replica circuit 820 tracks the output common-mode voltage of the amplifier 810, and may therefore be used to detect the output common-mode voltage. It is to be appreciated that the relative gate widths of the transistors are not limited to this example.

The voltage divider 850 generates a reference voltage Vref equal to half the power supply voltage Vdd. The reference voltage Vref represents a desired common-mode voltage equal to half the power supply voltage Vdd. To generate the reference voltage Vref, the voltage divider 850 comprises two resistors R2 coupled in series between the power supply voltage Vdd and ground, where the resistors have equal resistances. The reference voltage Vref is generated at the node 852 between the series resistors R2.

The feedback voltage V0 from the replica circuit is fed to a first input of the comparator 804, and the reference voltage Vref (representing the desired common-mode voltage) is fed to a second input of the comparator 804. The output of the comparator 804 generates the bias voltage Vbp for the first and second bias transistors 811 and 821.

In operation, the comparator 804 compares the difference between the feedback voltage V0 and the reference voltage Vref, and adjusts the bias voltage Vbp based on the comparison in a direction that minimizes the difference between V0 and Vref. In other words, the comparator 804 adjusts the bias voltage Vbp until the feedback voltage V0 is approximately equal to the reference voltage Vref. Because the reference voltage Vref is equal to half the power supply voltage, this causes the feedback voltage V0 from the replica circuit to be approximately equal to half the power supply voltage. Because the feedback voltage V0 from the replica tracks the output common-mode voltage of the amplifier 810, this causes the common-mode voltage to be approximately half the power supply voltage Vdd, thereby achieving high duty-cycle performance.

The driver stage 830 is configured to convert the large-differential signal at the differential output (v1, v2) of the amplifier 810 into a rail-to-rail signal at the differential output (Outp, Outn) of the conversion circuit 800. In this regard, the driver stage 830 comprises first and second serial inverters 840 and 842 coupled to one of the outputs (v1) of the amplifier 810, and third and fourth serial inverters 844 and 846 coupled to the other output (v2) of the amplifier 810. The large-differential signal input to the driver stage 830 may drive the outputs of inverters 842 and 846 rail to rail to generate the rail-to-rail signal. For example, if the inverters are powered between a first rail at the supply voltage Vdd and a second rail coupled to ground, then the rail-to-rail signal may have a voltage swing approximately equal to Vdd.

In some aspects, the amount of current (and hence power) consumed by replica circuit 820 may be reduced while still allowing the replica circuit to track the output common-mode voltage of the amplifier 810. This may be done, for example, by reducing the gate widths of the transistor 821 and 822 in the replica circuit, and increasing the resistance of the load resistor Rd1. For example, the gate width of the second bias transistor 821 may be reduced to one fourth the gate width of the first bias transistor 811, the gate width of the third driving transistor 822 may be reduced to one half the gate width of each of the first and second driving transistors 812 and 813, and the resistance of the load resistor Rd1 may be increased to twice the resistance of each of the load resistors R1 in the amplifier. In this example, the bias current through the load resistor Rd1 is reduced to one half the bias current through each of the load resistors R1 in the amplifier. However, since the load resistor Rd1 has twice the resistance, the voltage V0 across the load resistor Rd1 tracks the bias voltage across the each of the load resistors R1 in the amplifier, and hence the output common-mode voltage of the amplifier. The gate widths of the transistors 821 and 822 may be scaled down even further with a corresponding increase in the resistance of the load resistor Rd1 to further reduce power consumption by the replica circuit.

It is to be appreciated that the feedback voltage need not be equal to the output common-mode voltage. In general, the feedback voltage may be proportional to the output common-mode voltage. For example, the feedback voltage may be equal to half the output common-mode voltage with the reference voltage set to a voltage equal to half the desired output common-mode voltage. The example in which the feedback voltage approximately equals the output common-mode voltage corresponds to a case where the feedback voltage is proportional to the output common-mode voltage by a proportionality ratio of approximately one.

Figure 9:
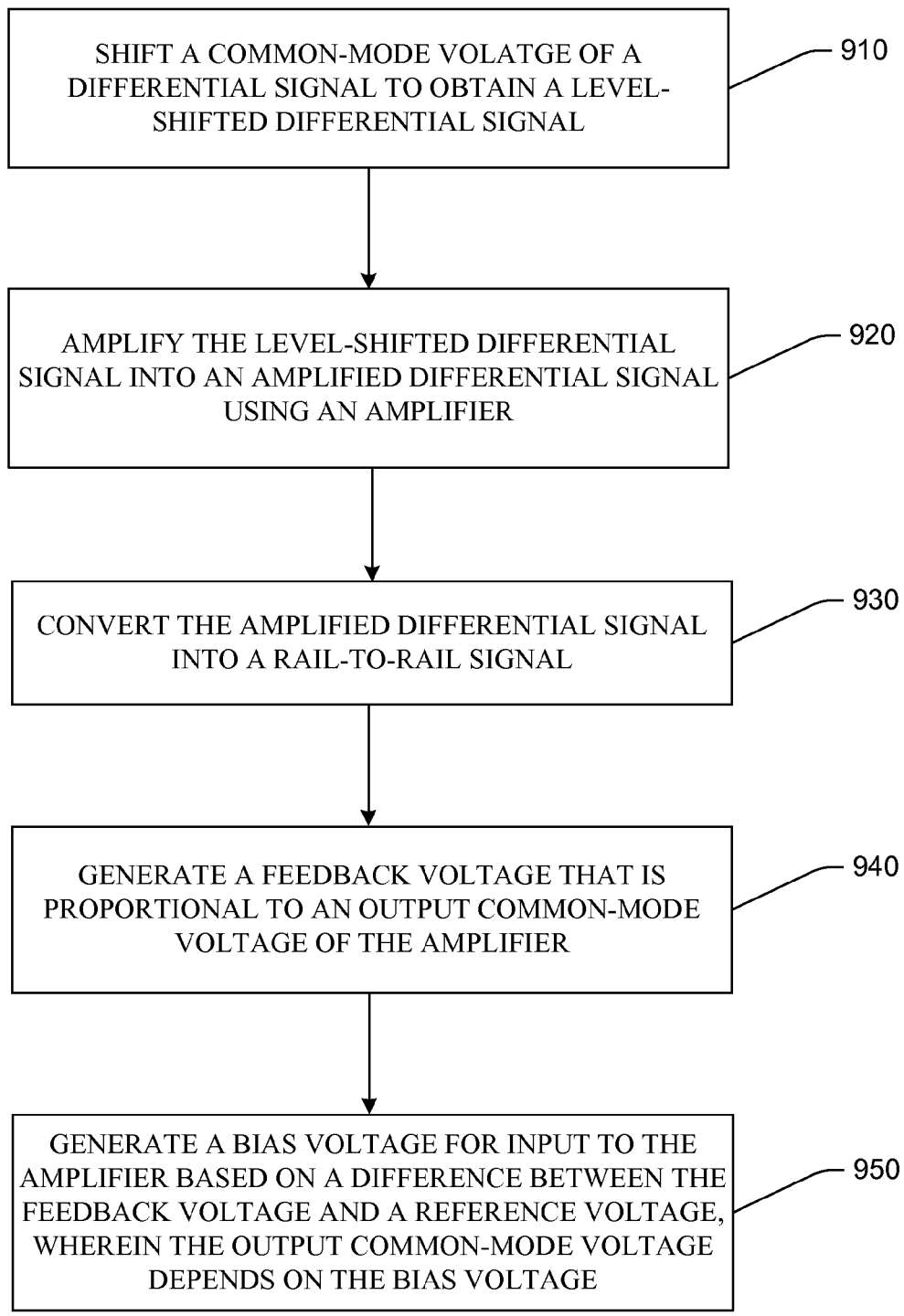
FIG. 9 is a flowchart illustrating a method for converting a differential signal to a large signal in a rail-to-rail format according to an embodiment of the present disclosure.

FIG. 9 is a flowchart illustrating a method 900 for converting a differential signal into a rail-to-rail signal according to an embodiment of the present disclosure. The method 900 may be performed by the signal-format conversion circuit 500 in FIG. 5 or the signal-format conversion circuit 800 in FIG. 8.

In step 910, a common-mode voltage of a differential signal is shifted to obtain a level-shifted differential signal. For example, the common-mode voltage may be shifted by transistors (e.g., transistors 602 and 612) arranged in a source-follower configuration. In this example, the common-mode voltage may be down shifted by a gate-to-source voltage of the transistors.

In step 920, the level-shifted differential signal is amplified into an amplified differential signal using an amplifier. For example, the level-shifted differential signal may be amplified into a large-differential signal by a wideband differential amplifier (e.g., amplifier 510 or 810).

In step 930, the amplified differential signal is converted into a rail-to-rail signal. For example, the amplified differential signal may be converted into a rail-to-rail signal by a plurality of inverters (e.g., inverters 540-546 or 840-846), in which the outputs of the inverters may be driven rail to rail by the amplified differential signal.

In step 940, a feedback voltage that is proportional to an output common-mode voltage of the amplifier is generated. For example, the feedback voltage may approximately equal the output common-mode voltage, and may be generated at a node between two series resistors (e.g., resistors R0) that are coupled between first and second outputs of the amplifier. In another example, the feedback voltage may be generated by a replica circuit (e.g., replica circuit 820) driven by an input common-mode voltage of the amplifier. The feedback voltage may be approximately equal to the output common-mode voltage and the reference voltage may be equal to half a supply voltage, which may represent an ideal output common-mode voltage for high duty-cycle performance.

In step 950, a bias voltage for input to the amplifier is generated based on a difference between the feedback voltage and a reference voltage, wherein the output-common mode voltage of the amplifier depends on the bias voltage. For example, the bias voltage may be input to a bias transistor (e.g., bias transistor 511 or 811) that provides a bias current for the amplifier.

Those skilled in the art would appreciate that the circuits described herein may be realized using a variety of transistor types, and are therefore not limited to the particular transistor types shown in the figures. For example, transistor types such as bipolar junction transistors, junction field effect transistor or any other transistor type may be used. Those skilled in the art would also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A receiver, comprising:
    a voltage-level shifter configured to shift a common-mode voltage of a differential signal to obtain a level-shifted differential signal;
    an amplifier configured to amplify the level-shifted differential signal into an amplified differential signal;
    a driver stage configured to convert the amplified differential signal into a rail-to-rail signal; and
    a common-mode feedback circuit configured to generate a feedback voltage that is proportional to an output common-mode voltage of the amplifier, and to generate a bias voltage for input to the amplifier based on a difference between the feedback voltage and a reference voltage, wherein the output common-mode voltage of the amplifier depends on the bias voltage.

2. The receiver of claim 1, wherein the feedback voltage is approximately equal to the output common-mode voltage of the amplifier.

3. The receiver of claim 2, wherein the reference voltage is approximately equal to half a power supply voltage.

4. The receiver of claim 1, wherein the common-mode feedback circuit further comprises a comparator having a first input configured to receive the feedback voltage, and a second input configured to receive the reference voltage, wherein the comparator is configured generate the bias voltage based on the difference between the feedback voltage and the reference voltage.

5. The receiver of claim 4, wherein the comparator comprises:
    a first n-type metal-oxide-semiconductor (NMOS) transistor having a gate coupled to the first input of the comparator, and a source coupled directly to a ground;
    a second NMOS transistor having a gate coupled to the second input of the comparator, and a source coupled directly to the ground;
    a current mirror load coupled to drains of the first and second NMOS transistors; and
    an output stage having a first input coupled to a drain of the first or second NMOS transistor, a second input coupled to the first or second input of the comparator, and an output for outputting the bias voltage.

6. The receiver of claim 1, wherein the common-mode feedback circuit comprises two series resistors coupled between first and second outputs of the amplifier, wherein the feedback voltage is generated at a node between the two series resistors.

7. The receiver of claim 1, further comprising a voltage divider configured to generate the reference voltage.

8. The receiver of claim 1, wherein the common-mode feedback circuit comprises:
    a common-mode voltage detection circuit configured to detect an input common-mode voltage of the amplifier; and
    a replica circuit that is driven by the detected input common-mode voltage, and configured to generate the feedback voltage based on the detected input common-mode voltage.

9. The receiver of claim 8, wherein the common-mode voltage detection circuit comprises two series resistors coupled between first and second inputs of the amplifier, and wherein the input common-mode voltage is detected at a node between the two series resistors.

10. The receiver of claim 9, wherein the feedback voltage is approximately equal to the output-common mode voltage of the amplifier.

11. The receiver of claim 8, wherein the replica circuit comprises:
 a bias transistor having a gate that is driven by the bias voltage;
 a driving transistor having a gate that is driven by the detected input common-mode voltage, and a source coupled to a drain of the bias transistor; and
 a load coupled to a drain of the driving transistor, wherein the feedback voltage is generated at a node between the drain of the driving transistor and the load.

12. The receiver of claim 1, wherein the voltage-level shifter comprises:
 a transistor having a gate coupled to an input of the voltage-level shifter, and a source coupled to an output of the voltage-level shifter; and
 a current source coupled to the source of the transistor, wherein the voltage-level shifter shifts the common-mode voltage of the differential signal at the input of the voltage-level shifter by a gate-to-source voltage of the transistor at the output of the voltage-level shifter.

13. The receiver of claim 1, wherein the driver stage comprises:
 a first inverter coupled to a first output of the amplifier; and
 a second inverter coupled to a second output of the amplifier.

14. A method for signal-format conversion, the method comprising:
 shifting a common-mode voltage of a differential signal to obtain a level-shifted differential signal;
 amplifying the level-shifted differential signal into an amplified differential signal using an amplifier;
 converting the amplified differential signal into a rail-to-rail signal;
 generating a feedback voltage that is proportional to an output common-mode voltage of the amplifier; and
 generating a bias voltage for input to the amplifier based on a difference between the feedback voltage and a reference voltage, wherein the output common-mode voltage of the amplifier depends on the bias voltage.

15. The method of claim 14, wherein the feedback voltage is approximately equal to the output common-mode voltage.

16. The method of claim 15, wherein the reference voltage is approximately equal to half a supply voltage.

17. The method of claim 14, wherein generating the feedback voltage comprises generating the feedback voltage based on an input common-mode voltage of the amplifier.

18. The method of claim 14, wherein generating the feedback voltage comprises generating the feedback voltage from a node between two series resistors, wherein the two series resistors are coupled between first and second outputs of the amplifier.

19. An apparatus for signal-format conversion, comprising:
 means for shifting a common-mode voltage of a differential signal to obtain a level-shifted differential signal;
 means for amplifying the level-shifted differential signal into an amplifier differential signal using an amplifier;
 means for converting the amplified differential signal into a rail-to-rail signal;
 means for generating a feedback voltage that is proportional to an output common-mode voltage of the amplifier; and
 means for generating a bias voltage for input to the amplifier based on a difference between the feedback voltage and a reference voltage, wherein the output common-mode voltage of the amplifier depends on the bias voltage.

20. The apparatus of claim 19, wherein the feedback voltage is approximately equal to the output common-mode voltage.

21. The apparatus of claim 20, wherein the reference voltage is approximately equal to half a supply voltage.

22. The apparatus of claim 19, wherein means for generating the feedback voltage comprises means for generating the feedback voltage based on an input common-mode voltage of the amplifier.

23. The apparatus of claim 19, wherein means for generating the feedback voltage comprises means for generating the feedback voltage from a node between two series resistors, wherein the two series resistors are coupled between first and second outputs of the amplifier.

24. A receiver, comprising:
 an amplifier configured to amplify a differential signal into an amplified differential signal;
 a driver stage configured to convert the amplified differential signal into a rail-to-rail signal;
 a common-mode voltage detection circuit configured to detect an input common-mode voltage of the amplifier;
 a replica circuit that is driven by the detected input common-mode voltage, and configured to generate a feedback voltage based on the detected input common-mode voltage; and
 a comparator having a first input configured to receive the feedback voltage, and a second input configured to receive a reference voltage, and configured to generate a bias voltage for input to the amplifier based on a difference between the feedback voltage and the reference voltage.

25. The receiver of claim 24, wherein the common-mode voltage detection circuit comprises two series resistors coupled between first and second inputs of the amplifier, wherein the detected input common-mode voltage is generated at a node between the two series resistors.

26. The receiver of claim 24, wherein the feedback voltage is approximately equal to an output common-mode voltage of the amplifier.

27. The receiver of claim 26, wherein the reference voltage is approximately equal to half of the power supply voltage.

28. The receiver of claim 24, wherein the replica circuit comprises:
 a bias transistor having a gate that is driven by the bias voltage;
 a driving transistor having a gate that is driven by the detected input common-mode voltage, and a source coupled to a drain of the bias transistor; and
 a load coupled to a drain of the driving transistor, wherein the feedback voltage is generated at a node between the drain of the driving transistor and the load.

* * * * *